(12) United States Patent
Higo et al.

(10) Patent No.: US 9,424,903 B2
(45) Date of Patent: Aug. 23, 2016

(54) MEMORY APPARATUS AND MEMORY DEVICE

(71) Applicant: Sony Corporation, Tokyo (JP)

(72) Inventors: Yutaka Higo, Kanagawa (JP);
Masanori Hosomi, Tokyo (JP);
Hiroyuki Ohmori, Kanagawa (JP);
Kazuhiro Bessho, Kanagawa (JP);
Tetsuya Asayama, Tokyo (JP);
Kazutaka Yamane, Kanagawa (JP);
Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/399,268

(22) PCT Filed: Mar. 6, 2013

(86) PCT No.: PCT/JP2013/001377
§ 371 (c)(1),
(2) Date: Nov. 6, 2014

(87) PCT Pub. No.: WO2013/171947
PCT Pub. Date: Nov. 21, 2013

(65) Prior Publication Data
US 2015/0109846 A1     Apr. 23, 2015

(30) Foreign Application Priority Data

May 16, 2012  (JP) ................ 2012-112424

(51) Int. Cl.
*G11C 5/08*     (2006.01)
*G11C 11/16*    (2006.01)
(Continued)

(52) U.S. Cl.
CPC ............. *G11C 11/161* (2013.01); *G11C 5/08* (2013.01); *G11C 11/1675* (2013.01); *H01L 27/228* (2013.01); *H01L 43/08* (2013.01)

(58) Field of Classification Search
CPC .. G11C 11/16; G11C 11/15; G11C 11/06035
USPC ................... 365/66, 158, 171, 173
See application file for complete search history.

(56) References Cited

U.S. PATENT DOCUMENTS

2007/0285975 A1   12/2007   Kawahara et al.
2009/0080124 A1   3/2009    Yoshikawa et al.
(Continued)

FOREIGN PATENT DOCUMENTS

JP    2004-193595    7/2004
JP    2007-310949    11/2007
(Continued)

OTHER PUBLICATIONS

International Search Report issued in connection with International Patent Application No. PCT/JP2013/001377, dated May 14, 2013. (2 pages).
(Continued)

*Primary Examiner* — Huan Hoang
(74) *Attorney, Agent, or Firm* — K&L Gates LLP

(57) ABSTRACT

To provide a memory apparatus capable of operating at high speed with less current and inhibiting a decrease in an amplitude of a readout signal.
A memory apparatus includes a memory device at least including a memory layer, a magnetic fixed layer, and an intermediate layer made of a non-magnetic body disposed between the memory layer and the magnetic fixed layer; current being capable of flowing in a lamination direction; a wiring for supplying current flowing to the lamination direction; and a memory control unit for storing information by flowing standby current at a predetermined level to the memory device via the wiring to incline the magnetization direction of the memory layer from the direction perpendicular to a film surface and flowing recording current that is higher than the standby current via the wiring to change the magnetization direction of the memory layer.

20 Claims, 14 Drawing Sheets

(51) Int. Cl.
*H01L 43/08* (2006.01)
*H01L 27/22* (2006.01)

(56) References Cited

U.S. PATENT DOCUMENTS

| | | |
|---|---|---|
| 2010/0010911 A1 | 1/2010 | Smith |
| 2010/0246251 A1 | 9/2010 | Chen et al. |
| 2011/0044099 A1* | 2/2011 | Dieny .................. B82Y 25/00 365/171 |
| 2011/0316102 A1 | 12/2011 | Ohmori |
| 2012/0063220 A1 | 3/2012 | Higo |

FOREIGN PATENT DOCUMENTS

| | | |
|---|---|---|
| JP | 2009-081215 | 4/2009 |
| JP | 2010-109372 | 5/2010 |
| JP | 2012-059809 | 3/2012 |
| JP | 2012-074716 | 4/2012 |

OTHER PUBLICATIONS

European Search Report issued Jan. 18, 2016, for corresponding EP Appln. No. 13790278.9 (11 pages).

* cited by examiner

A
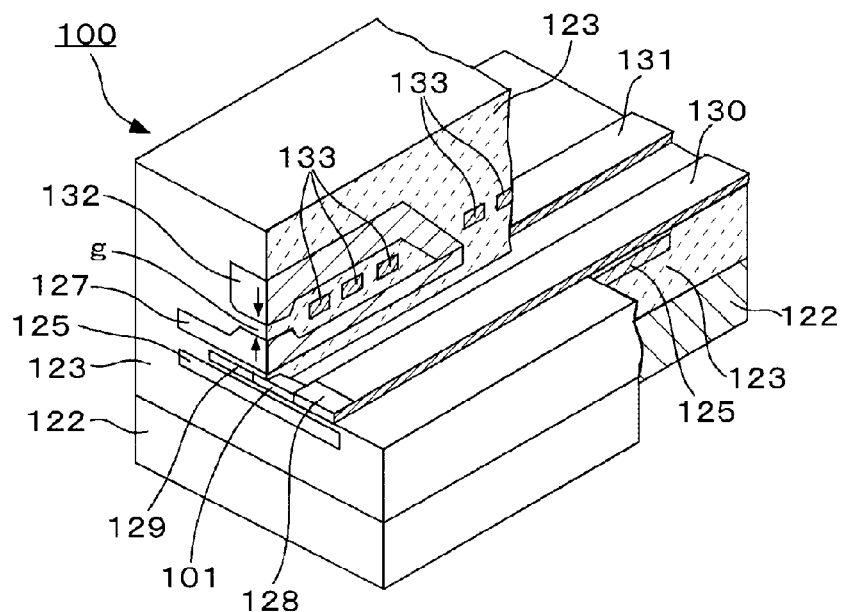
B
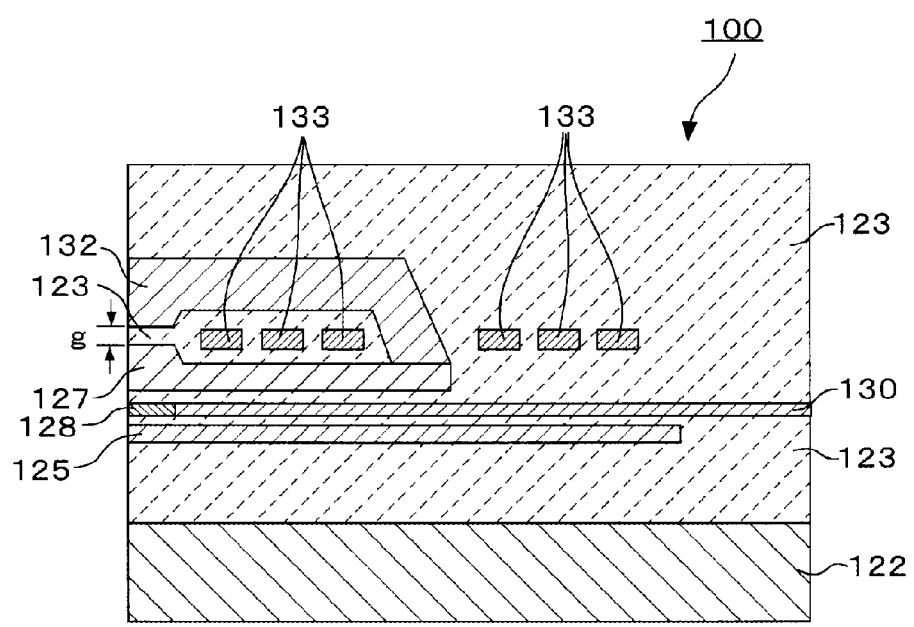
FIG.14

MEMORY APPARATUS AND MEMORY DEVICE

CROSS REFERENCES TO RELATED APPLICATIONS

The present application is a national stage of International Application No. PCT/JP2013/001377 filed on Mar. 6, 2013 and claims priority to Japanese Patent Application No. 2012-112424 filed on May 16, 2013, the disclosure of which is incorporated herein by reference.

BACKGROUND

The present invention relates to a memory apparatus and a memory device.

In an information processor such as a computer, a DRAM (Dynamic Random Access Memory) with high density that is operated at high speed is widely used.

However, the DRAM is a volatile memory where information is erased when the power is turned off. So, a non-volatile memory where information is not erased is needed.

As a candidate of the non-volatile memory, a magnetoresistive random access memory (MRAM) where information is recorded by magnetization of a magnetic body is focused on and is under development.

A method of recording to the MRAM includes a method of reversing magnetization by current magnetization or a method of reversing magnetization by directly implanting spin-polarized electrons into a recording layer (for example, see Patent Document 1).

As the method, spin implantation magnetization reversal is focused on because a record current can be decreased as the device size gets smaller.

Furthermore, in order to miniaturize the device, a method of using a perpendicular magnetization film where a magnetization direction of a magnetic body is directed to a perpendicular direction is studied (for example, see Patent Document 2).

Non-Patent Document 1 discloses a reversal time equation of a spin implantation magnetization reversal element using a perpendicular magnetization film.

Patent Document 1: Japanese Application Laid-open No. 2004-193595
Patent Document 1: Japanese Application Laid-open No. 2009-81215
Non-Patent Document: R. H. Koch et al, Phys. Rev. Lett. 92, 088302(2004)

SUMMARY

Problem to be Solved by the Invention

However, by the reversal time equation show in the Non-Patent Document 1, the spin implantation magnetization reversal element using the perpendicular magnetization film may prolong the magnetization reversal time as compared to the spin implantation magnetization reversal element using no perpendicular magnetization film.

An object of the present technology is to solve the problem in the case of using the perpendicular magnetization film and to provide a memory apparatus capable of operating at high speed with less current.

In addition, in the memory apparatus capable of operating at high speed with less current, another object is to inhibit an amplitude of a readout signal from decreasing.

Means for Solving the Problem

In order to solve the problem, according to the present technology, the memory apparatus is configured as follows:

The memory apparatus according to the present technology includes a memory device having: a layer structure at least including a memory layer where a direction of magnetization is changed corresponding to information, a magnetic fixed layer where the direction of the magnetization is fixed, and an intermediate layer made of a non-magnetic body disposed between the memory layer and the magnetic fixed layer; current being capable of flowing in a lamination direction of the layer structure.

The memory apparatus also includes a wiring for supplying the memory device with current flowing to the lamination direction; and a memory control unit for storing information by flowing standby current at a predetermined level to the memory device via the wiring to incline the magnetization direction of the memory layer from the direction perpendicular to a film surface and flowing recording current that is higher than the standby current via the wiring to change the magnetization direction of the memory layer.

According to the present technology, the memory device is configured as follows:

A memory device, comprising:

a layer structure at least including a memory layer where a direction of magnetization is changed corresponding to information, a magnetic fixed layer where the direction of the magnetization is fixed, an intermediate layer made of a non-magnetic body disposed between the memory layer and the magnetic fixed layer, and a cap layer; current being capable of flowing in a lamination direction of the layer structure;

in the memory layer, the first ferromagnetic layer, the connecting layer and the second ferromagnetic layer are laminated in this order, the first ferromagnetic layer is magnetically connected to the second ferromagnetic layer via the connecting layer, the first ferromagnetic layer is in contact with the intermediate layer, the second ferromagnetic layer is in contact with the cap layer, one of the first ferromagnetic layer and the second first ferromagnetic layer is the in-face magnetization layer being predominant in the in-face magnetization, and the other is the perpendicular magnetization layer being predominant in the perpendicular magnetization, and a connecting intensity between the first ferromagnetic layer and the second ferromagnetic layer via the connection layer is set such that both magnetizations of the first ferromagnetic layer and the second ferromagnetic layer direct to the perpendicular direction in an equilibrium state where no current in the lamination direction flows to the memory device, and the magnetization direction of the memory layer is inclined from the perpendicular direction in a standby state where standby current lower than the memory device flows to the memory device.

By the memory apparatus according to the present technology, information is stored by flowing the standby current to incline the magnetization direction of the ferromagnetic layer of the memory layer from the direction perpendicular to the film surface and flowing recording current to change the magnetization direction of the memory layer.

As the magnetization direction of the memory layer is inclined from the perpendicular direction before recording, the reversal time required to reverse the magnetization and to record information can be shortened as compared to the conventional configuration that the recording current flows in a state that the magnetization direction is not inclined. At the same time, variations in the reversal time produced in the conventional configuration that the recording current flows in a state that the magnetization direction is not inclined can be decreased.

By the memory apparatus according to the preset technology, the magnetization of the memory layer can be directed to the perpendicular direction to the film surface in the equilibrium state where no current flows through the memory device. If the magnetization of the memory layer is inclined from the direction perpendicular to the film surface in the equilibrium state, the amplitude of the readout signal may be decreased. However, according to the present technology, the decrease in the amplitude of the readout signal can be effectively inhibited.

By the memory device according to the preset technology, the magnetization of the memory layer directs to the perpendicular direction in the equilibrium state, by flowing the standby current, the magnetization direction of the memory layer is inclined from the direction perpendicular to the film surface.

Effect of the Invention

As described above, according to the present technology, as compared to the conventional configuration that simply uses the perpendicular magnetization film, the reversal time required to reverse the magnetization and to record information can be shortened and the variations in the reversal time can be decreased. In this way, the amount of current upon the information recording can be decreased, and the information can be recorded in a short time. As a result, there can be provided a memory apparatus capable of operating at high speed with less current.

In addition, in the memory apparatus capable of operating at high speed with less current, the decrease in the amplitude of the readout signal can be inhibited.

According to the memory device of the present technology, the magnetization of the memory layer directs to the direction perpendicular to the film surface in the equilibrium state, and by flowing the standby current, the magnetization direction of the memory layer is inclined from the direction perpendicular to the film surface.

Additional features and advantages are described herein, and will be apparent from the following Detailed Description and the figures.

BRIEF DESCRIPTION OF THE FIGURES

FIG. 14 Views showing an application of the memory device (magnetoresistive effect device) according to the embodiment to a combined magnetic head.

DETAILED DESCRIPTION

The embodiments of the present technology will be described in the following order.
<1. Schematic Configuration of Memory Apparatus according to Embodiment>
<2. Memory Devices in Prior Art and Related Art>
<3. Summary of Memory Device according to Embodiment>
<4. First Embodiment>
<5. Second Embodiment>
<6. Simulation Results>
<7. Procedure for shortening Recording Time>
<8. Alternative Embodiment>
<1. Schematic Configuration of Memory Apparatus according to Embodiment>

Firstly, a schematic configuration of a memory apparatus according to an embodiment will be described.

Figure 1:
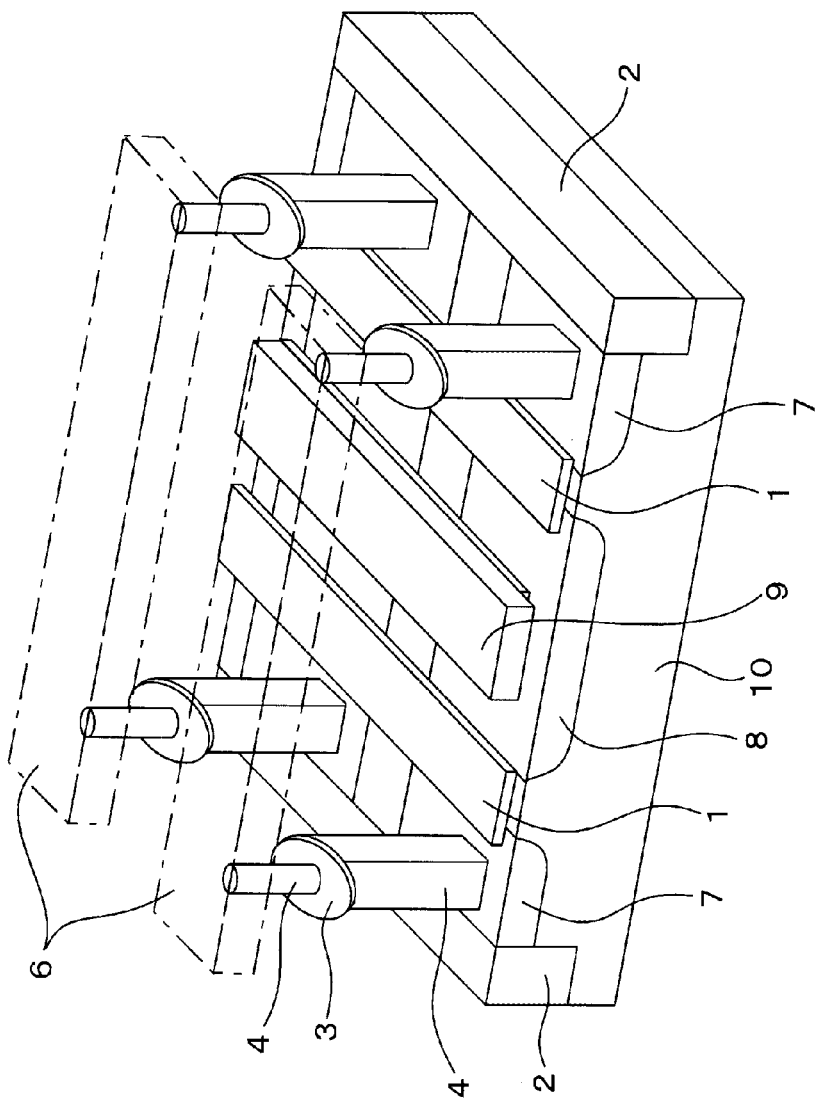
FIG. 1 A schematic perspective view of a memory apparatus of an embodiment.
Figure 2:
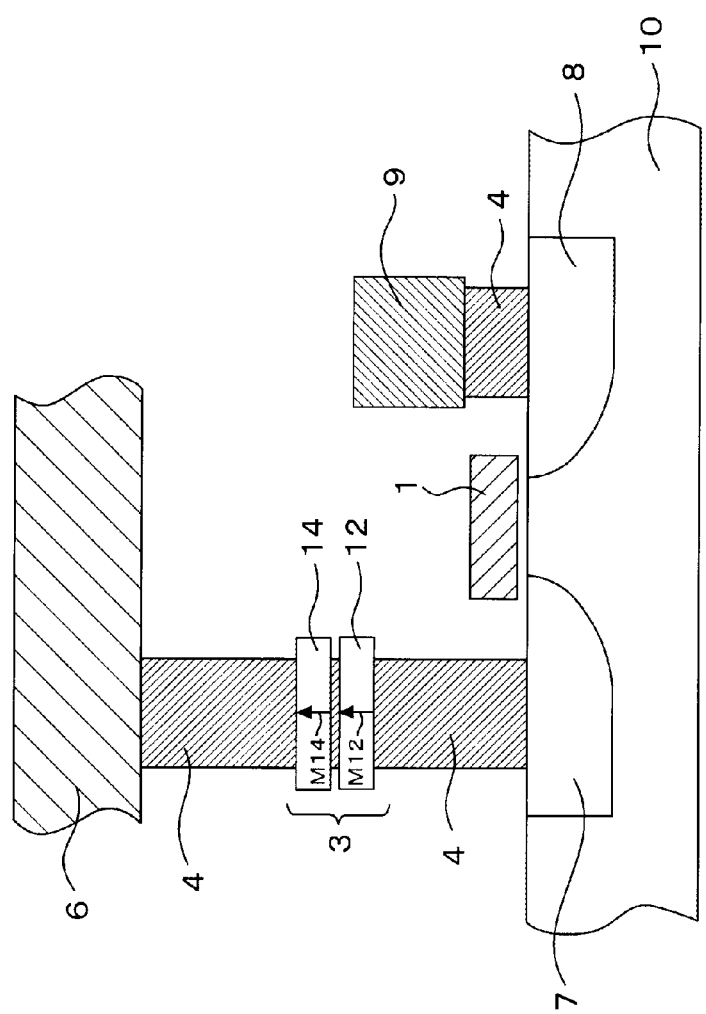
FIG. 2 A cross-sectional view of the memory apparatus of the embodiment.
Figure 3:
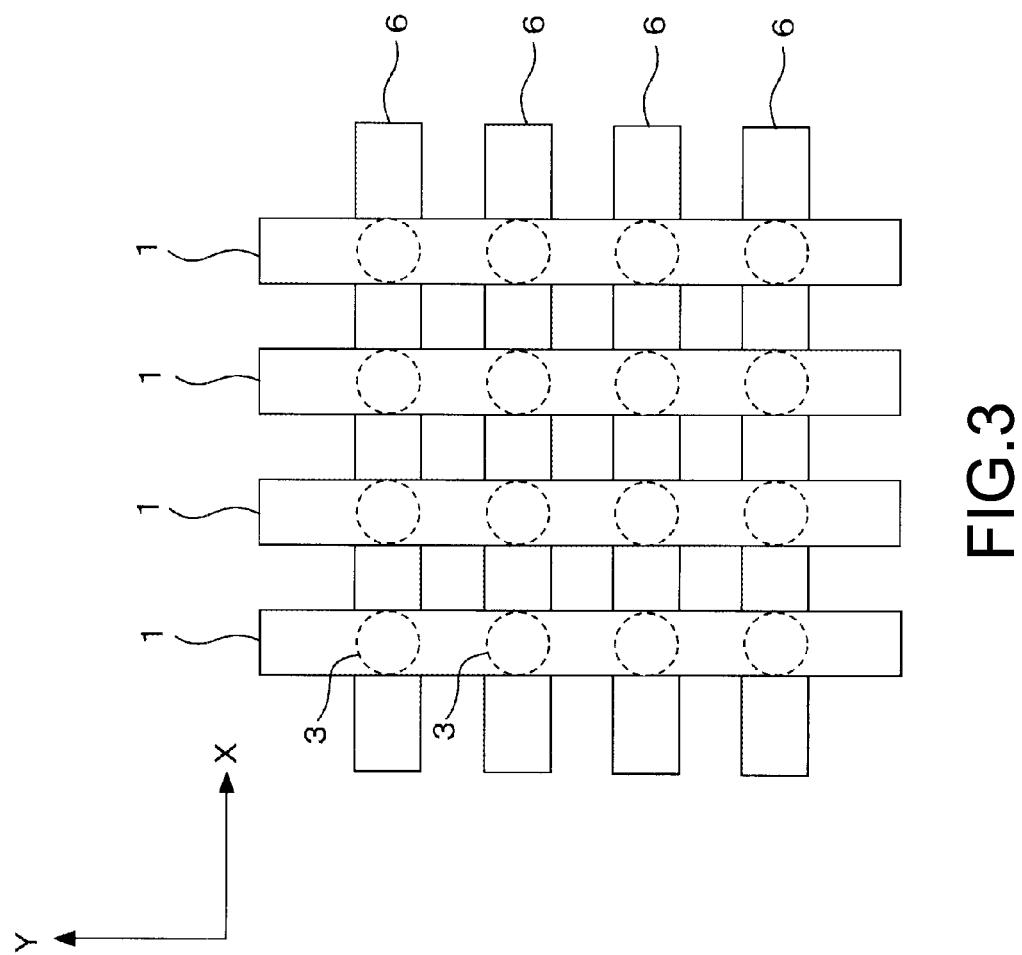
FIG. 3 A plan view of the memory apparatus of the embodiment.

Schematic views of the memory apparatus according to the embodiment are shown in FIG. 1, FIG. 2 and FIG. 3. FIG. 1 is a schematic perspective view, FIG. 2 is a cross-sectional view, and FIG. 3 is a plan view. Peripheral circuits of the memory apparatus according to the embodiment are not shown.

As shown in FIG. 1, in the memory apparatus according to the embodiment, there are disposed memory devices 3 (STT-MRAMs, Spin Transfer Torque-Magnetic Random Access Memories) being capable of holding information in a magnetized state at an intersection point of two types of address wirings (for example, a word line and a bit line) orthogonal to each other.

In other words, a drain region 8, source regions 7 and gate electrodes 1 that configure selection transistors for selecting memory devices 3 are formed at areas separated by device separation layers 2 on a semiconductor substrate 10 such as a silicon substrate. Among them, the gate electrodes 1 also function as the address wirings (word lines) extending in a front and back direction in FIG. 1.

The drain regions 8 are formed in common to left and right selection transistors in FIG. 1. To the drain regions 8, wirings 9 are connected.

Between the source regions 7 and bit lines 6 disposed at an upper side and extending in a left and right direction in FIG. 1, the memory devices 3 having memory layers where a magnetization direction is reversed by a spin torque magnetization reversal are disposed. The memory devices 3 are configured of magnetic tunnel junction devices (MTJ devices), for example.

As shown in FIG. 2, each memory device 3 has two magnetic layers 12, 14. As to the two magnetic layers 12, 14, one magnetic layer is a magnetization fixed layer 12 where a direction of magnetization M12 is fixed and the other magnetic layer is a free magnetization layer, i.e., a memory layer 14 where a direction of magnetization M14 is changed.

Each memory device 3 is connected to each bit line 6 and a source area 7 via each of up and down contact layers 14.

In this way, current flows to the memory device 3 through two types of the address wirings 1, 6 in an up and down direction (a lamination direction). By the spin torque magnetization reversal, the direction of the magnetization M14 of the memory layer 14 can be reversed.

As shown in FIG. 3, the memory apparatus is configured of the memory devices 3 at intersection points of a number of first wirings (word lines) 1 and second wirings (bit lines) 6 that are disposed orthogonal to each other in a matrix.

Each memory device 3 has a circular flat shape and a cross-section structure shown in FIG. 2.

Also, each memory device includes the magnetization fixed layer 12 and the memory layer 14, as shown in FIG. 2.

Thus, the respective memory devices 3 configure a memory cell of the memory apparatus.

Here, in such a memory apparatus, writing should be made at current lower than a saturated current of the selection transistor. It is known that the saturated current of the transistor is lowered as current can be decreased as the device size gets smaller. In order to decrease the memory apparatus, a spin transfer effectiveness is desirably improved to decrease the current flowing through the memory devices 3.

In order to increase the readout signal, a great magnetoresistive change rate is necessary. It is therefore effective to use the above-described MTJ structure, i.e., the memory device 3 including a tunnel insulation layer (tunnel barrier layer) as the intermediate layer between the two magnetic layers 12 and 14.

In this way, when the tunnel insulation layer is used as the intermediate layer, an amount of current flowing through the memory devices 3 is limited in order to prevent insulation breakdown of the tunnel insulation layer. In other words, in terms of assuring the reliability of repeated writing of the memory device 3, it is desirable that the current needed for the spin torque magnetization reversal be inhibited. The current needed for the spin torque magnetization reversal may be called as a reversal current or a recording current.

Also, as the memory apparatus according to the embodiment is a non-volatile memory apparatus, the information written by the current should be stored stably. In other words, the stability (the thermal stability) to thermal fluctuation of the magnetization of the memory layer 14 should be assured.

If the thermal stability of the memory layer 14 is not assured, a direction of the reversed magnetization may be re-reversed by heat (temperature at an operation environment), which may result in a holding error.

The memory devices 3 (STT-MRAMs) in the present memory apparatus can be advantageous in scaling, i.e., can have a small volume as compared to the conventional MRAM. However, when the volume is decreased, the thermal stability tends to be decreased as long as other properties are the same.

When it promotes an increase in the capacity of the STT-MRAM, the memory devices 3 have smaller volume. Thus, the thermal stability becomes an important matter.

Therefore, the memory devices 3 (STT-MRAMs) are desirably designed to have sufficient thermal stability even though the volume may be decreased, as the thermal stability is a very important property.

<2. Memory Devices in Prior Art and Related Art>

Figure 4:
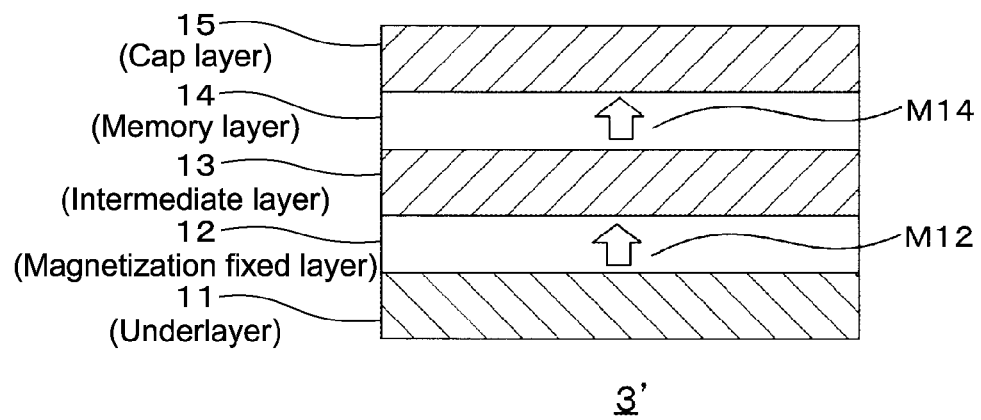
FIG. 4 An explanatory view (cross-sectional view) about a schematic configuration of a prior art memory device (STT-MRAM) where a magnetization direction is perpendicular to a film surface.

Before the description of the memory devices 3 according to the embodiment, referring to the cross-sectional view of FIG. 4, there is described a schematic configuration of a memory device 3' in the prior art (STT-MRAM) where a magnetization direction of a memory layer (a magnetization direction in an equilibrium state) is perpendicular to a film surface.

As illustrated later, the configuration of the memory layers 14 of the memory devices 3 according to the present embodiment is different from that of the conventional one. In the description referring to FIG. 4, the memory layer "14" of the memory device 3' in the prior art is used as a symbol of the memory layer for convenience.

As shown in FIG. 4, the memory device 3' in the prior art includes an underlayer 11, a magnetization fixed layer (also referred to as a reference layer) 12 where a direction of magnetization M12 is fixed, an intermediate layer (a non-magnetic layer: a tunnel insulation layer) 13, a memory layer where a direction of magnetization M14 is variable (a free magnetization layer) 14 and a cap layer 15 laminated in this order.

Among them, in the magnetization fixed layer 12, the direction of the magnetization M12 is fixed by a high coercive force, etc. In this case, the direction of the magnetization of the magnetic fixed layer 12 is fixed in a direction perpendicular to the film surface.

In the memory device 3', information is stored by the direction of the magnetization (a magnetic moment) M14 of the memory layer 14 having a uniaxial anisotropy.

Information is written into the memory device 3' by flowing current to a direction perpendicular to film surfaces of the respective layers (i.e., a lamination direction of the respective layer) in the memory device 3' to induce the spin torque magnetization reversal.

Here, the spin torque magnetization reversal will be described briefly.

An electron has two types of spin angular momentum. They are defined as upward spin angular momentum and downward spin angular momentum.

Within the non-magnetic body, the electrons having upward spin angular momentum and the electrons having downward spin angular momentum are the same in number. In contrast, within a ferromagnetic body, they are different in number.

Firstly, the following case is taken in consideration. The directions of the magnetization M12 and the magnetization M14 are non-parallel in two ferromagnetic layers (the magnetization fixed layer 12 and the memory layer 14) laminated via an intermediate layer 13 and the electrons are moved from the magnetization fixed layer 12 to the memory layer 14.

The electrons passed through the magnetization fixed layer 12 are spin polarized, i.e., the electrons having upward spin angular momentum and the electrons having downward spin angular momentum are different in number.

When the intermediate layer 13 used as the tunnel insulation layer is sufficiently thin, the electrons reach other magnetic body, i.e., the memory layer (the free magnetization layer) 14 before a spin polarization is relaxed to a non-polarized state (the electrons having upward spin angular momentum and the electrons having downward spin angular momentum are the same in number).

Signs of the spin polarization in the two ferromagnetic bodies (the magnetization layer 12 and the memory layer 14) are reversed. In order to decrease energy in the system, a part of the electrons is reversed, i.e., the spin angular momentum is changed. In this case, total angular momentum of the system should be saved. Counteraction equivalent to the total of angular momentum change by turned electrons is provided to the magnetization M14 of the memory layer 14.

When the amount of current, i.e., the number of the electrons passing through in a unit time is small, a total number of the turned electrons is small and the angular momentum change generated on the magnetization M14 of the memory layer 14 is also small. When the amount of the current is increased, many angular momentum changes can be provided in a unit time.

A time change of the angular momentum is torque. Once the torque exceeds a certain threshold, the magnetization M14 of the memory layer 14 starts a precession movement and becomes stable after 180 degree rotation by the uniaxial anisotropy of the memory layer 14. In other words, a reversal from a non-parallel state to a parallel state takes place.

On the other hand, when the magnetization M14 of the memory layer 14 and the magnetization M12 of the ferromagnetic body 12 are in the parallel state and current flows inversely in a direction where the electrons flows through from the memory layer 14 to the magnetic fixed layer 12, the electrons are in turn reflected on the magnetic fixed layer 12.

As the electrons reflected having a spin direction inversed add torque upon entering into the memory layer 14 to invert the direction of the magnetization M14 of the memory layer 14, the magnetization M12 and the magnetization M14 can be inverted to the non-parallel state.

Note that the amount of current needed to inverse from the parallel state to the non-parallel state is increased as compared to that from the non-parallel state to the parallel state.

As to the inversion from the parallel state to the non-parallel state, an intuitive understanding is difficult. It may be considered that the magnetization M12 of the magnetization fixed layer 12 is fixed and cannot be reversed, and the magnetization M14 of the magnetization fixed layer 14 is reversed in order to save the angular momentum in the whole system.

In this way, 0/1 information can be recorded by flowing current corresponding to each polarity at a certain threshold value or more from the magnetization fixed layer (the reference layer) 12 to the memory layer 14 or vice versa.

The information is readout using the magnetoresistance effect similar to the case of a conventional MRAM.

In other words, current flows in the direction perpendicular to the film surfaces of the respective layers (i.e., the lamination direction of the respective layer) similar to the case that the information is recorded as described earlier. It utilizes a phenomenon that electrical resistance shown by the memory device 3' is changed whether or not the direction of the magnetization M14 of the memory layer 14 is parallel or non-parallel to the direction of the magnetization M12 of the magnetic fixed layer (the reference layer) 12.

A material used for the intermediate layer 13 used as the tunnel insulation layer may be metal or an insulator. When the insulator is used in the intermediate layer 13, a higher readout signal (resistivity change) is provided and the recording can be made at less current. Such a device is called as the magnetic tunnel junction device (the MTJ device).

A magnitude of the above-described spin torque is changed by an angle between the magnetization M14 of the memory layer 14 and the magnetization M12 of the magnetization fixed layer (reference layer) 12.

"m1" stands for a unit vector representing the direction of the magnetization M14 and "m2" stands for a unit vector representing the direction of the magnetization M12. The magnitude od the spin torque is proportional to m1×(m1× m2), where "x" represents the cross product of the vector.

In general, the magnetization M12 of the magnetization fixed layer 12 is fixed to a magnetization easy axis direction of the memory layer 14. The magnetization M14 of the memory layer 14 tends to direct to the magnetization easy axis direction of the memory layer 14 itself. In this case, the m1 and the m2 make an angle of 0 degree (parallel) or 180 degrees (non-parallel).

FIG. 4 illustrates the directions of the magnetization M12 and the magnetization M14 when the angle between the m1 and the m2 is 0 degree.

In this way, when the angle between the m1 and the m2 is 0 degree or 180 degrees, the spin torque will not entirely work at all according to the above-described spin torque equation.

However, in practice, the spin torque functions to induce the magnetization reversal when the angle between the magnetization M14 of the memory layer 14 and the magnetization M12 of the magnetization fixed layer 12 is distant from 0 degree or 180 degrees, as the magnetization M14 of the memory layer 14 is distributed randomly around the magnetization easy axis direction by the thermal fluctuation.

A time to induce the magnetization reversal (the reversal time) depends on a distance between the magnetization M14 and the magnetization easy axis direction. The longer the distance between the magnetization M14 and the magnetization easy axis, the faster the magnetization is reversed.

As described above, the angle between the magnetization M14 of the memory layer 14 and the magnetization easy axis is distributed randomly by the thermal fluctuation, the reversal time will be varied widely.

In order to rotate faster even if the magnetization M14 is positioned near (angle) the magnetization easy axis, flowing a large current is necessary for that.

To this end, the present inventors have been earnestly studied to operate the memory device at a high speed with a small current.

As a result, the memory layer 14 is configured of a perpendicular magnetization layer being predominant in perpendicular magnetization magnetically connected to an in-face magnetization layer being predominant in in-face magnetization via a connecting layer, whereby it has been discovered that both magnetizations are inclined from a direction perpendicular to the film surface by a magnetic interaction between the magnetization of the in-face magnetization layer and the magnetization of the perpendicular magnetization layer (see Reference Documents 1 and 2, for example).

As the magnetization direction of the memory layer 14 is inclined from the perpendicular direction, the reversal time can be shortened as compared to the conventional one that the magnetization direction of the memory layer 14 directs to the perpendicular direction. The reversal time is required to flow the recording current (reversal current), to reverse the magnetization and to record information. In addition, variations in the reversal time in the conventional configuration can be avoided. In this way, the amount of current upon information recording can be decreased and the information can be recorded in a short time, which can provide a memory apparatus being capable of operating at high speed with less current.

A ferromagnetic layer having the magnetization direction being inclined from the direction perpendicular to the film surface is hereinafter referred to as an "inclined magnetization layer".

Reference Document 1: Japanese Patent Application No. 2011-261522

Reference Document 2: Japanese Patent Application No. 2011-261853

A magnetic material for the inclined magnetization layer can be Co—Fe—B.

In general, the ferromagnetic layer used for the memory layer etc. has very thin film thickness as compared to a film area. In this case, when the magnetization of the ferromagnetic layer directs to the direction perpendicular to the film surface, a great diamagnetic field is provided. By interaction between the diamagnetic field and the magnetization, diamagnetic field energy (hereinafter referred to as Ed) is increased such that the magnetization cannot stably direct to the perpendicular direction and directs to the in-face direction in the equilibrium state.

Note that the ferromagnetic layer may have perpendicular magnetic anisotropy depending on a material and an interface state. In this case, perpendicular magnetic anisotropy energy (hereinafter referred to as Ea) induced by the perpendicular magnetic anisotropy acts on the ferromagnetic layer. When the magnetization of the ferromagnetic layer directs to the direction perpendicular to the film surface, diamagnetic field energy becomes net Ed-Ea.

When the diamagnetic field energy becomes negative, i.e., Ed<Ea, the magnetization can be stable and direct to the perpendicular direction. Hereinafter, the ferromagnetic layer is called as the "perpendicular magnetization layer being predominant in perpendicular magnetization".

In contrast, when the diamagnetic field energy becomes positive, i.e., Ed>Ea, the magnetization cannot be stable and direct to the perpendicular direction. Hereinafter, the ferromagnetic layer is called as the "in-face magnetization layer being predominant in in-face magnetization".

The ferromagnetic layer using Co—Fe—B is generally the in-face magnetization layer being predominant in the in-face magnetization.

However, Co—Fe—B can be the perpendicular magnetization layer being predominant in the perpendicular magnetization, if conditions are met.

Specifically, when the composition and the film thickness of the Co—Fe—B film are within the certain range and the Co—Fe—B film is in contact with an oxide film (for example, a MgO film), the Co—Fe—B film becomes the perpendicular magnetization layer being predominant in the perpendicular magnetization (for example, see Japanese Patent Application No. 2010-200983).

The perpendicular magnetic anisotropy for providing the perpendicular magnetization is considered to be originated from interfacial anisotropy at an interface between MgO and Co—Fe—B.

When both interfaces of the Co—Fe—B film are in contact with the MgO film, i.e., MgO/Co—Fe—B/MgO, the perpendicular magnetic anisotropy will be increased (for example, see Japanese Patent Application No. 2010-201526).

Thus, the ferromagnetic layer using Co—Fe—B can be the in-face magnetization layer being predominant in the in-face magnetization or the perpendicular magnetization layer being predominant in the perpendicular magnetization, and is therefore desirable to provide the above-described inclined magnetization layer.

Referring to the cross-sectional view of FIG. 5, a schematic configuration of a prior art memory device 3" (STT-MRAM) using the inclined magnetization layer will be described.

Although the configuration of the memory layers 14 of the prior art memory device 3" is different from that of the present embodiment. Here, the symbol "14" is also used for convenience.

Figure 5:
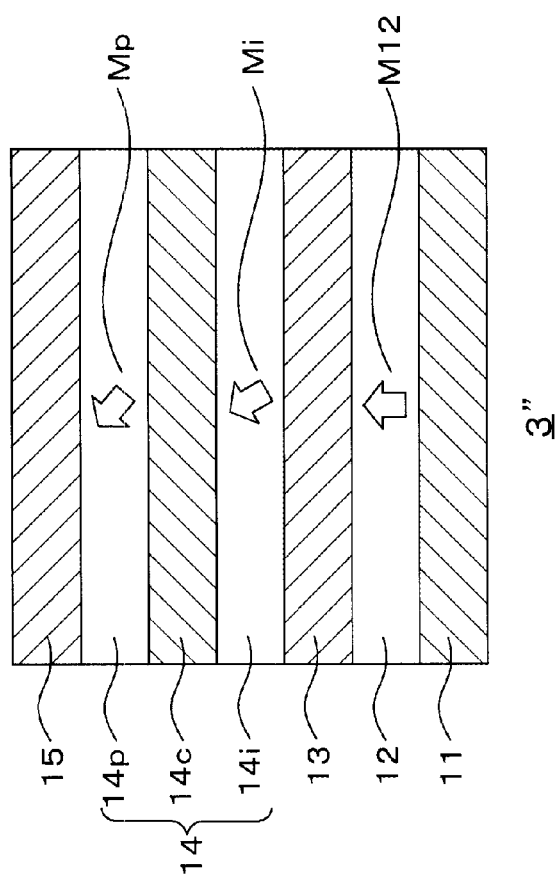
FIG. 5 A schematic configuration (cross-sectional view) of a prior art memory device.

In FIG. 5, the memory device 3" includes the underlayer 11, the magnetization fixed layer (the reference layer) 12 where the direction of the magnetization M12 is fixed, the intermediate layer (the non-magnetic layer: the tunnel insulation layer) 13, the memory layer where the direction of the magnetization M14 is variable (the free magnetization layer) 14 and the cap layer 15 laminated in this order.

As described above, the direction of magnetization M12 is fixed in the direction perpendicular to the film surface (upward in the Figure).

The memory device 3" has the memory layer 14 in a multilayer structure including a ferromagnetic layer and a connecting layer.

Specifically, in this case, the memory layer 14 has a three-layer structure where a ferromagnetic layer 14i, a connecting layer 14c and a ferromagnetic layer 14p are laminated in this order.

The ferromagnetic layer 14i is the in-face magnetization layer being predominant in the in-face magnetization.

The ferromagnetic layer 14p is the perpendicular magnetization layer being predominant in the perpendicular magnetization.

The ferromagnetic layer 14i is in contact with the intermediate layer 13, and the ferromagnetic layer 14p is in contact with the cap layer 15.

In the above-described configuration, magnetization Mi of the ferromagnetic layer 14i is magnetically connected to magnetization Mp of the ferromagnetic layer 14p via the connecting layer 14c.

The information is readout using the magnetoresistance effect similar to the case of the memory device 3'.

In other words, current flows in the direction perpendicular to the film surfaces of the respective layers (i.e., the lamination direction of the respective layer) similar to the case that the information is recorded as described earlier. It utilizes a phenomenon that electrical resistance shown by the memory device 3" is changed depending on a relative angle between the magnetization M12 of the magnetic fixed layer 12 and the magnetization Mi of the ferromagnetic layer 14i.

In the case of the prior art memory device 3" shown in FIG. 5, as the magnetization Mi is inclined from the perpendicular direction, the relative angle of the magnetization Mi is increased and the amplitude of the readout signal is smaller than that in the memory device 3' in the prior art using the perpendicular magnetization film.

Figure 6:
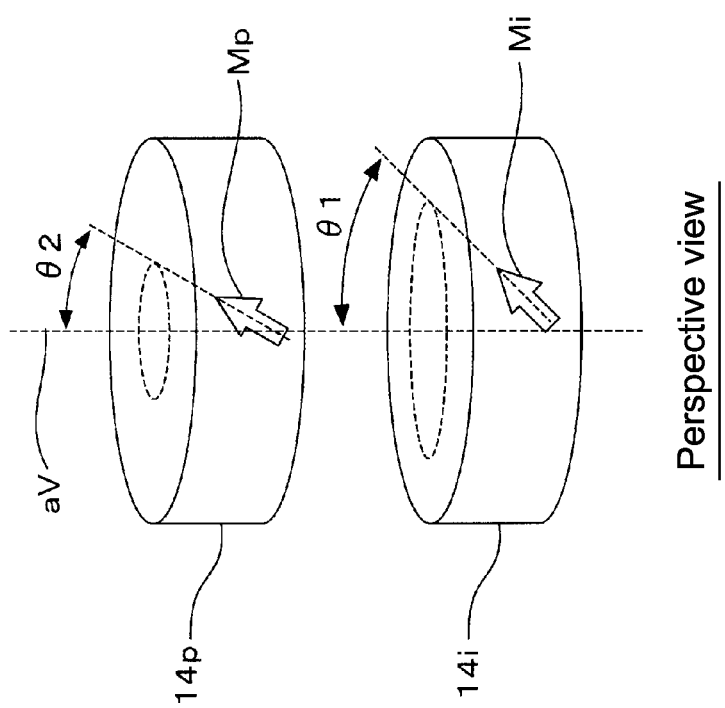
FIG. 6 A schematic configuration (perspective view) of a memory layer in the prior art memory device.

FIG. 6 shows a further detail of the configuration of the memory layer 14 of the prior art memory device 3" shown in FIG. 5.

For convenience, the connecting layer 14c is omitted.

Firstly, the memory layer 14 of the memory device 3" is in a cylindrical shape.

Here, in order to describe the directions of the magnetization Mi and the magnetization Mp, angles θ1 and θ2 are defined as follows: In other words, an axis penetrating through the memory layer 14 in the perpendicular direction is defined as a perpendicular axis aV. An angle between the magnetization Mi and the perpendicular axis aV is defined as θ1. An angle between the magnetization Mp and the perpendicular axis aV is defined as θ2.

As described above, the magnetization Mi is predominant in the in-face magnetization and the magnetization Mp is predominant in the perpendicular magnetization.

Accordingly, when the magnetization direction is inclined from the perpendicular axis aV by connecting via the connecting layer 14c, the angle θ1 will be greater than the angle θ2. In other words, the magnetization Mi is greatly inclined from the perpendicular axis aV.

The greater the relative angle between the magnetization M12 of the magnetic fixed layer 12 the magnetization Mi of the ferromagnetic layer 14i is, the greater the spin torque is. By the above-described configuration of the memory layer 14 in the prior art, the magnetization can be reversed at a higher speed.

However, the inclination of the magnetization Mi from the perpendicular axis aV leads to a side effect that the amplitude of the readout signal is decreased.

As understood from the description so far, the amplitude of the readout signal equals to a difference between electrical resistance values of the memory device in the parallel state and the memory device in the non-parallel state.

In the memory device 3' in the prior art, the angle between the magnetization M12 and the magnetization Mi is about 0 degree in the parallel state, and the angle between the magnetization M12 and the magnetization Mi is about 180 degrees in the non-parallel state. In contrast, in the prior art memory device 3", the magnetization Mi is inclined from the perpendicular axis aV as described above. Therefore, the angle between the magnetization M12 and the magnetization Mi exceeds 0 degree. As a result, the electrical resistance value in the parallel state in the prior art is greater than that of the memory device 3' in the prior art. Also in the non-parallel state, the magnetization Mi is inclined from the perpendicular axis aV. Therefore, the angle between the magnetization M12 and the magnetization Mi is less than 180 degrees. As a result, the electrical resistance value in the non-parallel state in the prior art is smaller than that of the memory device 3' in the prior art.

Consequently, the difference between the electrical resistance values of the prior art memory device 3" in the parallel state and in the non-parallel state is smaller than that in the memory device 3' in the prior art. This shows that the amplitude of the readout signal in the prior art is smaller than that in the conventional one.

In view of the problems of the prior art, according to the embodiment, the magnetization of the memory layer is directed to the perpendicular direction in the equilibrium state where no current flows through the memory device. Upon the recording, before the recoding current flows, current smaller than the recording current flows through the memory device to change the memory layer to a standby state. In other words, the direction of the magnetization of the memory layer is changed from the perpendicular direction to the inclined direction.

In this manner, both of the magnetization reversal at a high speed and the great readout signal can be provided.

<4. First Embodiment>

Hereinafter, a specific embodiment of the present technology will be described.

Figure 7:
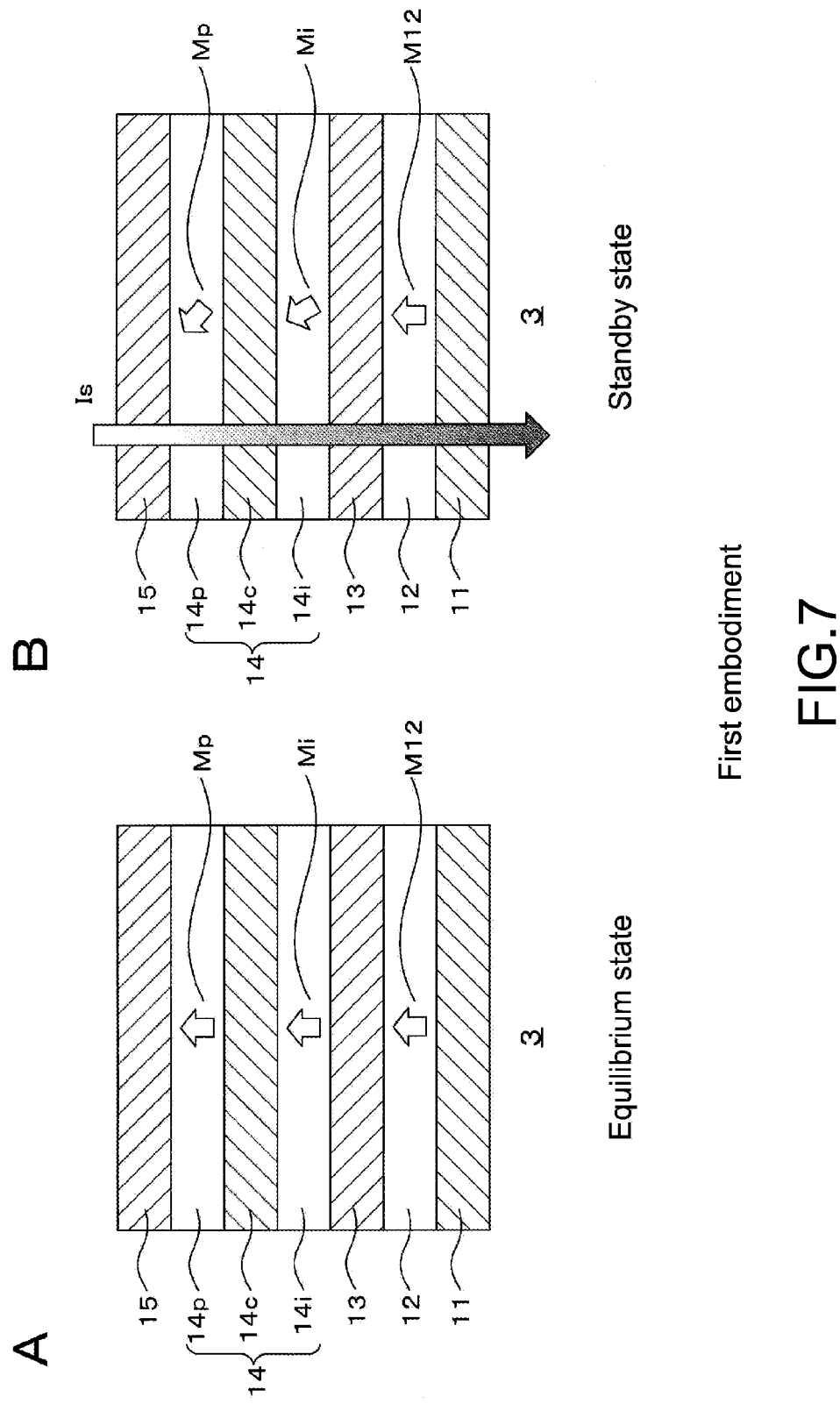
FIG. 7 Explanatory views of a memory device according to the first embodiment.

FIG. 7 are explanatory views of a memory device 3 according to a first embodiment.

In FIG. 7, FIG. 7A shows a schematic configuration (cross-sectional view) of the memory device 3 in the first embodiment.

In the following description, components already described are denoted by the same reference numerals, and thus detailed description thereof will be hereinafter omitted.

In FIG. 7A, the memory device 3 includes the underlayer 11, the magnetization fixed layer 12, the intermediate layer 13, the memory layer 14 and the cap layer 15 laminated similar to those of the prior art memory device 3". The memory layer 14 of the memory device 3 includes the ferromagnetic layer 14i, the connecting layer 14c and the ferromagnetic layer 14p are laminated similar to those in the prior art.

In this embodiment, Co—Fe—B is used for the ferromagnetic layer 14i and the connecting layer 14c.

However, the memory device 3 according to the embodiment is different from the memory device 3" in that the memory layer 14 is configured such that the magnetizations Mi and Mp direct to the perpendicular direction in the equilibrium state where no current flows through the memory device 3.

This can be achieved by increasing an intensity (hereinafter referred to as a connecting intensity) of the magnetic interaction between the magnetization of the ferromagnetic layer 14i (the in-face magnetization layer) and the magnetization of the ferromagnetic layer 14p (the perpendicular magnetization film) via the connecting layer 14c. In other words, in the memory device 3 according to the embodiment, the connecting intensity between the ferromagnetic layer 14i and the ferromagnetic layer 14p is set such that the magnetizations Mi and Mp direct to the perpendicular direction in the equilibrium state. The connecting intensity between the ferromagnetic layer 14i and the ferromagnetic layer 14p can be adjusted by the film thickness of the connecting layer 14c.

The directions of the magnetizations Mi and Mp depend on the connecting intensity. When the connecting intensity exceeds a certain threshold, the directions of the magnetizations Mi and Mp are matched in the same direction. The directions of both may be in the in-face direction or the perpendicular direction. By increasing the perpendicular magnetic anisotropy of the perpendicular magnetization layer being predominant in the perpendicular magnetization, it is possible to direct both in the perpendicular direction.

In this way, by increasing the connecting intensity in the equilibrium state above the threshold value, both magnetizations can direct to the perpendicular direction.

This allows the amplitude of the readout signal to be increased to the similar level of the memory device 3' in the prior art using the perpendicular magnetization film.

FIG. 7B schematically shows that a standby current Is flows through the memory device 3 to change the state of the memory device 3 into a standby state.

As shown in FIG. 7B, the standby current Is flows in a lamination direction of the memory device. When the standby current Is flows, Joule heat is generated in the memory device 3 and the memory layer 14 is increased in temperature. The connecting intensity depends on the temperature. As the temperature is increased, the connecting intensity tends to be decreased.

At this time, when the connecting intensity in the standby state is lower than the threshold value, the directions of the magnetizations Mi and Mp are changed from the perpendicular direction to the inclined direction.

According to the embodiment, the memory device 3 is changed to the standby state, and the recording current flows to store the information. As described above, the memory layer 14 has the inclined magnetization in the standby state. The recording current flows in the standby state to store the information, thereby reversing the magnetization at a high speed similar to the memory device 3" in the prior art.

On the other hand, according to the embodiment, as the magnetizations Mp and Mi direct to the perpendicular direction in the equilibrium state, the amplitude of the readout signal will not be decreased being different from that in the prior art.

Examples of the materials used for each of lamination films of the memory device 3 will be described. A description about the components already described as to the memory device 3" in the prior art will be hereinafter omitted.

For the connecting layer 14c, a non-magnetic metal such as Ta, Ru and the like can be used.

For the intermediate layer (the non-magnetic layer) 13 between the magnetization fixed layer 12 and the memory layer 14, an insulation material (a variety of oxides, etc.) for forming the tunnel insulation layer or a non-magnetic metal used between the magnetic layers of the magnetoresistive effect device can be used.

When the insulation material is used for the intermediated layer 13, the higher readout signal (the resistivity change) is provided and the recording can be made at less current, as described above.

In the first embodiment, in order to provide the ferromagnetic layer 14p that is the perpendicular magnetization layer being predominant in the perpendicular magnetization, an oxide such as MgO can be used for the cap layer 15. Although not shown, by laminating the non-magnetic metal such as Ta, Ru and the like on the MgO layer in the cap layer 15, electric conductivity is desirably increased.

For the magnetic fixed layer 12, a variety of magnetic materials used in the memory device of the conventional STT-MRAM can be used.

For example, NiFe, TePt, CoPt, TbFeCo, GdFeCo, CoPd, MnBi, MnGa, PtMnSb, Co—Fe—B, Co—Cr based materials etc. can be used. Other than these materials, the magnetic materials can be used.

Figure 8:
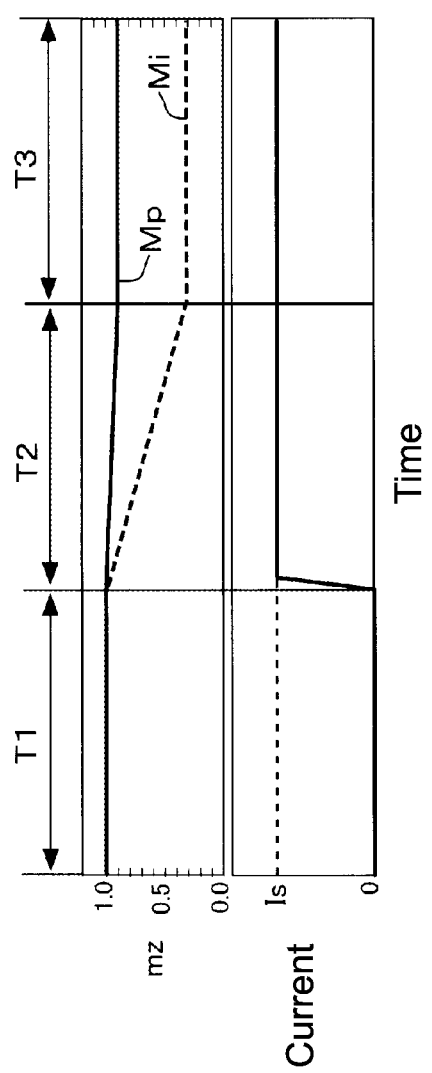
FIG. 8 A conceptual diagram between current flowing in a lamination direction of the memory device and a time change of perpendicular components (mz) of magnetization Mi and magnetization Mp.

Referring to FIG. 8, changes from the equilibrium state to the standby state and to the recording state will be specifically described.

FIG. 8 is a conceptual diagram between current flowing in a lamination direction of the memory device 3 and a time change of perpendicular components (mz) of magnetization Mi and magnetization Mp.

In a time domain T1, the memory layer 14 is in the equilibrium state and the perpendicular components mz of magnetization Mi and magnetization Mp are "1", i.e., in the perpendicular direction.

Before a recording operation, the standby current Is flows to the memory device 3 from an end point of the time domain T1 to change to the standby state. Then, as the memory device 3 is increased in temperature, the connecting intensity is decreased and the perpendicular components of the magnetizations Mi and Mp are decreased from "1" (time domain T2). Thereafter, the memory device 3 is uniform in temperature. The directions of the magnetizations Mi and Mp are determined by the connecting intensity at that time (time domain T3). In other words, a stable state can be provided as the standby state.

In this way, after the stable standby state is provided (i.e., at any moment within the time domain T3), the recording current flows to conduct actual recording.

Figure 9:
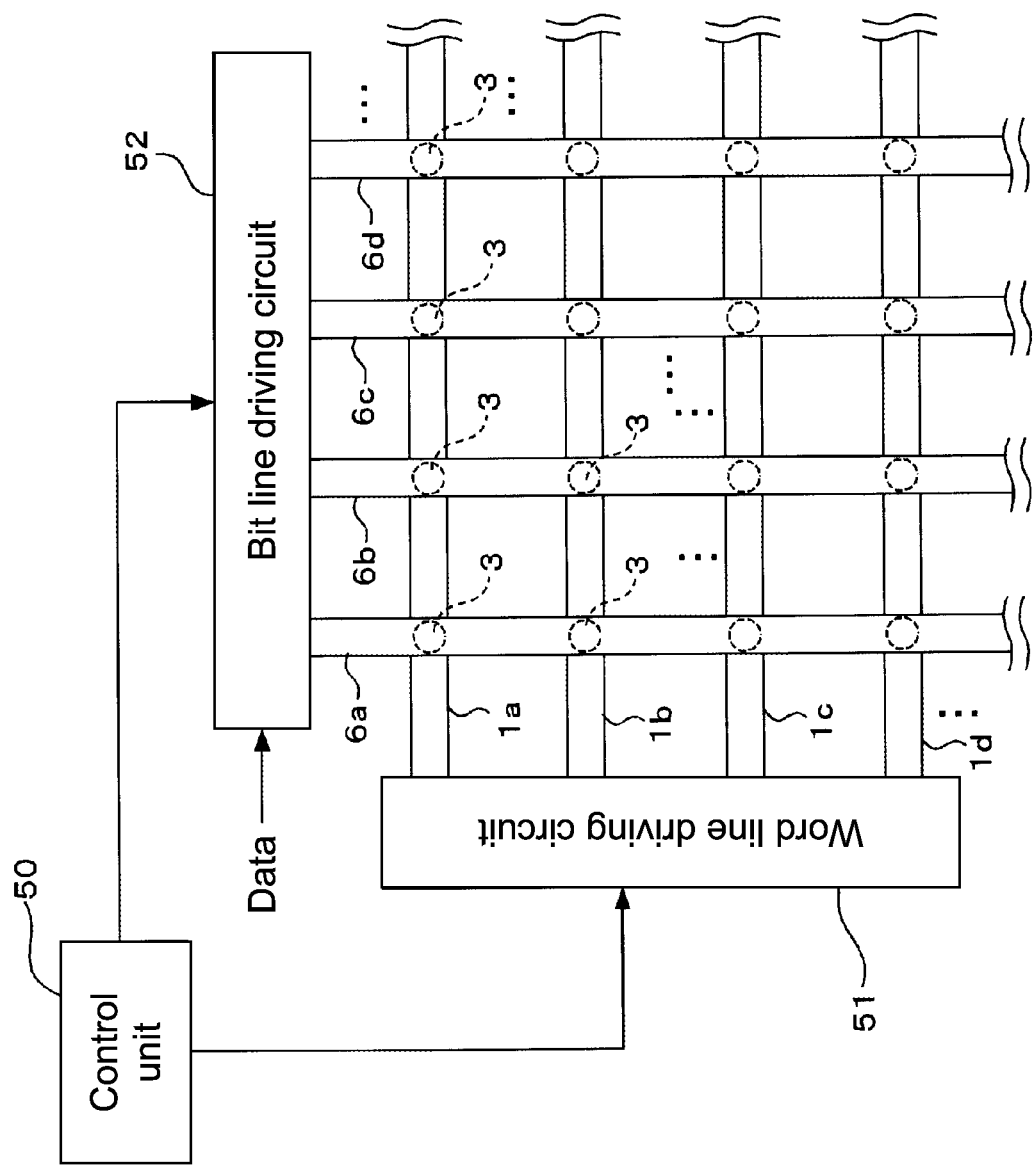
FIG. 9 A block diagram showing an overall configuration of the memory apparatus according to the first embodiment.

FIG. 9 is a block diagram showing an overall configuration of the memory apparatus according to the embodiment, which includes the configuration that the memory device 3 is in the standby state and the information is then stored as described above.

As illustrated in FIG. 3, the memory apparatus according to the embodiment is configured of the memory devices 3 at intersection points of the word lines 1 and the bit lines 6 that are disposed orthogonal to each other in a matrix.

In FIG. 9, symbols 1a, 1b, 1c, 1d . . . are added to a plurality of the word lines 1 from the above in FIG. 9 and symbols 6a, 6b, 6c, 6d . . . are added to a plurality of the bit lines 6 from the left in FIG. 9, for convenience.

The memory apparatus according to the embodiment includes a word line driving circuit 51 for driving the word lines 1, a bit line driving circuit 52 for driving the bit lines 6 in accordance with input data, and a control unit 50.

The control unit 50 controls a driving timing of the word lines 1 by the word line driving circuit 51, and also controls a driving timing of the bit lines 6 by the bit line driving circuit 52. Specifically, while one word line 1 is driven (selected) by the word line driving circuit 51, the bit lines 6 are driving in accordance with the input data by the bit line driving circuit 52. Such a control is sequentially executed by changing the word line 1 selected. In this way, data can be stored on the desired memory device 3.

Figure 10:
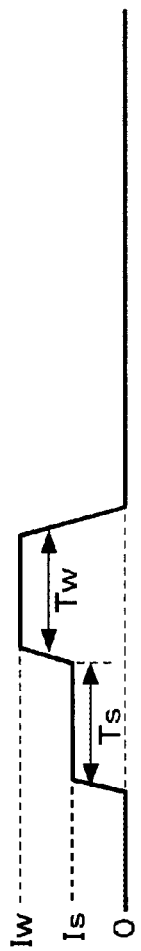
FIG. 10 An explanatory view for a procedure for driving bit lines according to the embodiments.

At this time, the control unit 50 controls such that the standby current shown in FIG. 10 flows from the bit line driving circuit 52 to each bit line 6 corresponding to data recording. Specifically, before a recording current Iw flows, the bit line driving circuit 52 is controlled to flow the standby current Is. As apparent from FIG. 10, the standby current Is is lower than the recording current Iw (comparison by an absolute values).

Although only one polarity (positive polarity) is shown as polarities of the standby current Is and the recording current Iw in FIG. 10, 0/1 can be recorded by changing the direction of the current flowing through the memory device, as described above. For example, when the polarity shown in FIG. 10 corresponds to wiring data "1", current having the polarity reversed from FIG. 10 flows to write data "0".

As a supply period of the standby current Is (a period from the standby current Is is started to be flowed to the recording current Iw is started to be flowed) shown as "Ts" in FIG. 10A, it is desirable to assure the period for maintaining temperature of the memory device 3 constant and stabilizing the directions of the magnetizations Mi and Mp after the standby current Is is started to be fed, as understood from FIG. 8.

Note that this does not deny that the recording current Iw is started to be fed before the directions of the magnetizations Mi and Mp are stabilized. It is possible to flow the recording current Iw to start the recording operation before the standby state is stabilized (at any moment within the time domain T2 shown in FIG. 8).

<5. Second Embodiment>

Subsequently, referring to FIG. 11, a memory device 20 according to a second embodiment will be described.

Figure 11:
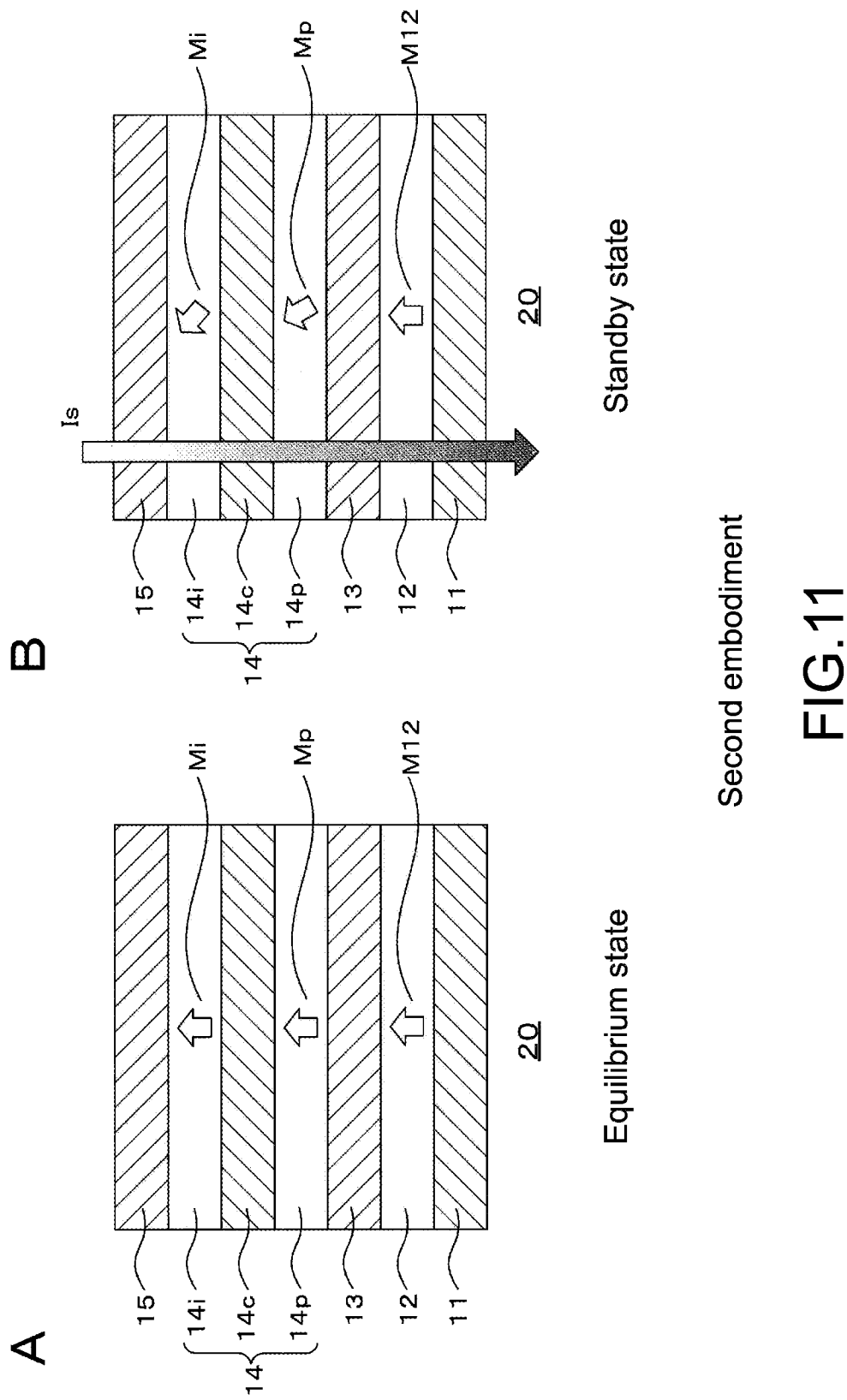
FIGS. 11 Explanatory views of a memory device according to the second embodiment.

In FIG. 11, FIG. 11A is a schematic configuration view (cross-sectional view) of the memory device 20. FIG. 11A shows the magnetizations Mi and Mp in the equilibrium state of the memory device 20 and the magnetization M12 of the magnetization fixed layer 12.

The memory device 20 according to the second embodiment is different from the memory device 3 according to the first embodiment in that the order of the memory layers 14 is different. Specifically, the ferromagnetic layer 14p, the connecting layer 14c and the ferromagnetic layer 14i are laminated in this order. In this case, the ferromagnetic layer 14p is in contact with the intermediate layer 13, and the ferromagnetic layer 14i is in contact with the cap layer 15.

In order to provide the ferromagnetic layer 14p that is the perpendicular magnetization layer being predominant in the perpendicular magnetization, an oxide such as MgO can be used for the intermediate layer 13.

In the memory device 20 having the above-described configuration, the spin torque is determined by the relative angle between the magnetization M12 of the memory layer 12 and the magnetization Mp of the ferromagnetic layer 14p.

FIG. 11B shows the magnetization Mi of the ferromagnetic layer 14i and the magnetization Mp of the ferromagnetic layer 14p when the standby current Is flows to the memory device 20 to a standby state.

In the memory device 20, the angle θ2 (the angle between the magnetization Mp and the perpendicular axis aV) is smaller than the angle θ1 (the angle between the magnetization Mi and the perpendicular axis aV). Accordingly, the spin torque in the memory device 20 is smaller than that of the memory device 3 according to the first embodiment. However, as compared to the memory device 3' in the prior art, the direction of the magnetization (the magnetization in the standby state) of the memory layer 14 is inclined, thereby allowing the magnetization reversal at the higher speed upon recording operation.

For confirmation, the memory apparatus according to the second embodiment includes a memory device 20 instead of the memory device 3 in the memory apparatus having the configuration shown in FIG. 9 earlier.

Also, the memory apparatus according to the second embodiment including the above-described memory device 20 can prevent the amplitude of the readout signal to be decreased while the memory apparatus can be operated at high speed with less current.

<6. Simulation Results>

In order to prove the effectiveness of the memory devices (3, 20) according to the respective embodiments as described above, the magnetization reversal was simulated by a macro spin model.

Figure 12:
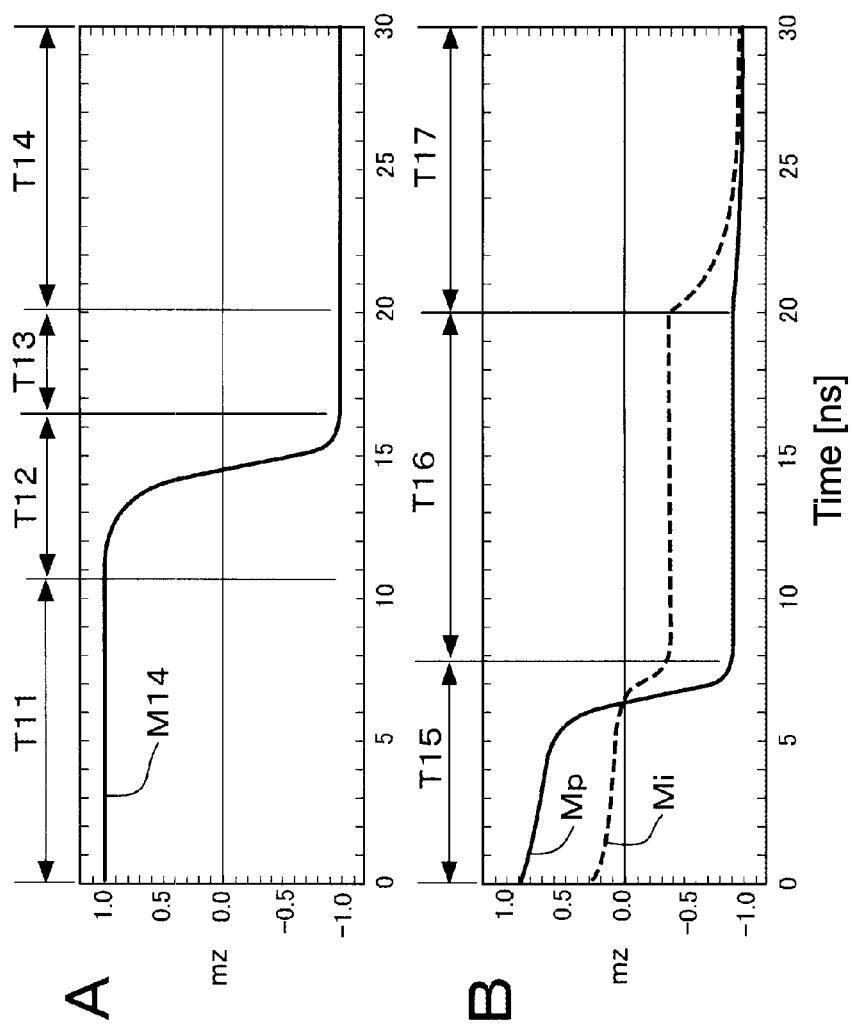
FIGS. 12 Diagrams showing a time change of perpendicular components of magnetization of a memory device in the prior art and magnetization (magnetization Mi) of the memory layer of the memory device according to the embodiment.

FIG. 12 show simulated results about time changes of the perpendicular components (mz) of the magnetization when the current flows.

FIG. 12A shows the simulated results about the memory device 3' in the prior art, and FIG. 12B shows the simulated results about the memory device according to the embodiment. In the FIG. 12B, as "the memory device according to the embodiment", the memory device 20 according to the second embodiment was used.

In FIG. 12A and FIG. 12B, a horizontal axis represents an elapsed time after the current flows, and a vertical axis represents the perpendicular components mz of magnetization. An upward direction is 1, and a downward direction is −1. A current flowing time (also referred to as a current supply time) was 20 nm. An original time point is when the recording current is started to be flowed to the memory layer 14 in the standby state.

In the memory device 3' in the prior art, the magnetization M14 of the memory layer 14 directs to the perpendicular direction in the equilibrium state. As the spin torque does not function as it is, calculation was made by tilting 0.01 degrees from the vertical axis aV.

In a calculation example shown in FIG. 12B, the magnetization M14 of the memory layer 14 directs to the direction at 29 degrees from the vertical direction in the standby state, and the magnetization Mi of the ferromagnetic layer 14i directs to the direction at 73 degrees from the vertical direction in the standby state.

In the memory device 3' in the prior art, as the direction of the magnetization M14 is almost in the direction perpendicular to the film surface, the spin torque gets smaller and a change in the magnetization motion gets smaller to the time change. Consequently, as shown in a time domain T11 of FIG. 12A, there is a domain where the magnetization direction is almost not changed, even if current flows.

Here, a length of the time domain T11 is changed every recording operation depending on an initial angle of the magnetization. Accordingly, a time for the magnetization reversal is varied, and a sufficiently long recording time is necessary for reversing the magnetization with certainty.

After the time domain T11, the direction of the magnetization M14 is rapidly changed to induce the magnetization reversal (a time domain T12). After a time domain T13 where current supply is continued, the current becomes zero in a time domain T14.

In contrast, in the memory device according to the embodiment, the magnetization Mp of the ferromagnetic layer 14p is inclined from the direction perpendicular to the film surface in the standby state. Accordingly, the magnetization Mp of the ferromagnetic layer 14p is subjected to some spin torque once the recording current flows to rapidly start the reversal operation (time domain T15). At this time, as the magnetization Mi of the ferromagnetic layer 14i is magnetically connected to the magnetization Mp, a reversal motion is started in tune with the motion of the magnetization Mp.

Thus, according to the memory device of the embodiment, the magnetization reversal at a high speed is possible.

In the case of the memory device of the embodiment, there is no time domain where the change in the magnetization motion is small like the time domain T11 shown in FIG. 12A. This means that not only the memory device of the embodiment can shorten the time to flow the recording current, and but also the variations in the reversal time can be decreased.

Here, during a time domain T16 where the current supply is continued, the directions of the magnetization Mp and the magnetization Mi are off from the perpendicular direction due to an effect of a temperature increase and the spin torque.

By the calculation from FIG. 12B, an angle of the magnetization Mp is 156 degrees and an angle of the magnetization Mi is 112 degrees.

When the current becomes zero in a time domain T17, the connecting intensity returns to the original magnitude and it changes to the equilibrium state directing to the perpendicular direction.

From the result, it is also shown that the memory device of the embodiment can prevent the amplitude of the readout signal to be decreased while the high speed writing is possible with less current, as the magnetization M14 of the memory layer 14 directs to the perpendicular direction in the equilibrium state.

Although in the simulation in FIG. 12, the memory device 20 was used as the memory device according to the embodiment, an improvement effect can be provided when the memory device 3 in the first embodiment is used as compared to the memory device 3' in the prior art or the memory device 3" in the related art.

<7. Procedure for shortening Recording Time>

As understood from the description, the memory apparatus of the embodiment changes the state of the memory device to the standby state before the recording operation. While the time required for the recording operation itself is shortened, the time to change to the standby state will be required. In order to shorten the time, a procedure for performing the recording operation in a plurality of the memory devices can be employed as described later.

Figure 13:
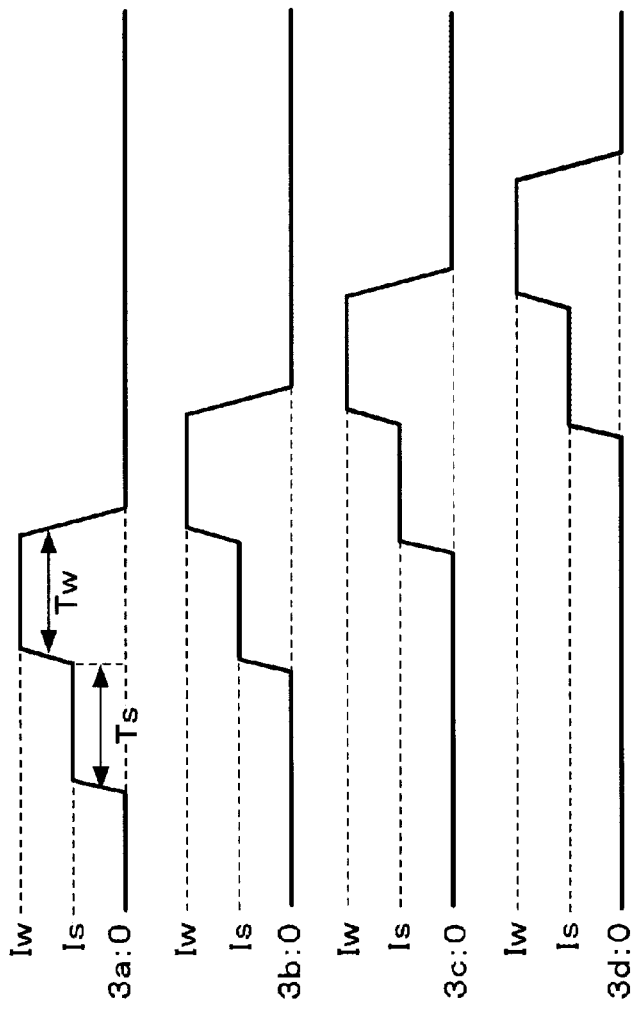
FIG. 13 An explanatory view for a procedure for shortening a recording time.

FIG. 13 is an explanatory view for the procedure for shortening the recording time.

In FIG. 13, a continuous recording by the memory devices 3*a*, 3*b*, 3*c* and 3*d* in this order is simulated, and current waveforms to be supplied to the memory devices 3*a* to 3*d* are shown. Herein, the memory devices 3*a* to 3*d* are the memory devices 3 positioned serially on a word line 1.

The conditions are as follows: the word line 1 at which the memory devices 3*a* to 3*d* are positioned is HIGH, and current is capable of flowing through the memory devices 3.

On the condition that the word line 1 is selected and the current is capable of flowing through the memory devices 3*a* to 3*d*, the current having the waveforms shown in FIG. 13 is supplied to respective bit lines 6.

Specifically, the current is supplied to the respective bit lines 6 such that a period (Tw) for flowing the recording current Iw to the memory devices 3 to be recorded and a period (Ts) for flowing the standby current Is to the memory devices 3 to be recorded are overlapped.

Here, if the four memory devices 3, i.e., the memory devices 3*a* to 3*d*, independently perform the recording operation, it requires a time of 4×(Ts+Tw). However, the recording in a pipeline method shown in FIG. 13 can shorten the required time to Is+4×Tw.

In this way, an overhead period required to change to the standby state before the recording operation can be decreased by the continuous recording where the period for flowing the standby current and the period for flowing the recording current are overlapped.

The above-described recording in the pipeline method can be achieved by the control unit 50 shown in FIG. 9 earlier that generates a timing signal and supplies it to the bit line driving circuit 52. The timing signal is for overlapping the period where the recording current Iw flows to the memory devices 3 to be recorded and the period where the standby current Is to the memory devices 3 to be recorded, as described above.

Although FIG. 13 illustrate the case that the memory devices 3 are used, the recording in the pipeline method can also be performed using the memory devices 20 to shorten the recording time.

<8. Alternative Embodiment>

While the present technology is described herein with reference to illustrative embodiments, it should be understood that the present technology is not limited thereto.

For example, although as the material for providing the Co—Fe—B film with the perpendicular magnetic anisotropy, an oxide such as MgO is cited, a variety of materials other than the oxide can be used.

The material of the connecting layer 14*c* is not limited to Ta and Ru, and may be such that a magnetic connection can be generated between the ferromagnetic layers, e.g., Zr, V, Cr, Nb, Mo, W, and Mg.

The underlayer 11 or the cap layer 15 may be a single material or a laminated structure of a plurality of materials.

The magnetization fixed layer 12 may be a monolayer structure or a laminated Feripin structure including two layers of the ferromagnetic layer and the non-magnetic layer. In addition, an antiferromagnetic film may be added to a film of the Feripin structure.

In the present technology, a film structure of the memory device may be such that the memory layer is disposed at upper side or a lower side of the magnetization fixed layer.

In addition, a so-called dual structure where the magnetization layers are disposed at upper and lower of the memory layer may be employed.

The memory devices 3, 20 according to the present technology are each configured of a magnetoresistive effect device such as a TMR device. The magnetoresistive effect device such as a TMR device can be applied not only to the above-described memory apparatus, but also to a variety of electronic devices and electric devices including a magnetic head, a hard disk drive to which the magnetic head is mounted, an integrated circuit chip, and a variety of electronic devices and electric devices including a personal computer, a mobile terminal, a mobile phone and a magnetic sensor device.

As an example, FIG. 14A and FIG. 14B show an application of the above-described memory devices 3, 20, i.e., a magnetoresistive effect device 101 to a combined magnetic head 100. FIG. 14A is a perspective view partly cutting away to show an internal structure. FIG. 14B is a sectional view of the combined magnetic head 100.

The combined magnetic head 100 is a magnetic head used for a hard disk apparatus etc., and includes a substrate 122, the magnetoresistive effect magnetic head according to the present technology formed on the substrate 122, an inductive magnetic head laminated on the magnetoresistive effect magnetic head. The magnetoresistive effect magnetic head functions as a playback head, and the inductive magnetic head functions as a recording head. In other words, the combined magnetic head 100 is configured by combining the playback head and the recording head.

The magnetoresistive effect magnetic head mounted on the combined magnetic head 100 is a so-called MR head, and includes a first magnetic shield 125 formed via an insulation layer 123 on the substrate 122, magnetoresistive effect device 101 formed via the insulation layer 123 on the first magnetic shield 125, and a second magnetic shield 127 formed via the insulation layer 123 on the magnetoresistive effect device 101. The insulation layer 123 is composed of an insulation material such as $Al_2O_3$ and $SiO_2$.

The first magnetic shield 125 is for magnetically shielding a lower layer of the magnetoresistive effect device 101, and is composed of a soft magnetic material such as Ni—Fe. On the first magnetic shield 125, the magnetoresistive effect device 101 is formed via the insulation layer 123.

The magnetoresistive effect device 101 functions as a magnetosensitive device for detecting a magnetic signal from a magnetic recording medium in the magnetoresistive effect magnetic head. The magnetoresistive effect device 101 has the film configuration (the layer structure) similar to that of the above-described memory devices 3, 20.

The magnetoresistive effect device 101 is formed in a substantially rectangular shape such that one side face is exposed to an opposite face of the magnetic recording medium. At both ends of the magnetoresistive effect device 101, bias layers 128, 129 are disposed. Connecting terminals 130, 131 are formed to connect to the bias layers 128, 129. Via the connecting terminals 130, 131, sense current is supplied to the magnetoresistive effect device 101.

At upper parts of the bias layers 128, 129, the second magnetic shield layer 127 is disposed via the insulation layer 123.

The above-described inductive magnetic head laminated on the magnetoresistive effect magnetic head includes a magnetic core composed of the second magnetic shield 127 and an upper layer core 132, and a thin film coil 133 formed to wind the magnetic core.

The upper layer core 132 forms a closed magnetic path together with the second magnetic shield 122 to be the magnetic core of the inductive magnetic head, and is composed of a soft magnetic material such as Ni—Fe. The second magnetic shield 127 and the upper layer core 132 are formed such that front ends thereof are exposed to the opposite face of the magnetic recording medium and back ends thereof are in contact with the second magnetic shield 127 and the upper layer core 132. The front ends of the second magnetic shield 127 and the upper layer core 132 are formed at the opposite face of the magnetic recording medium such that the second magnetic shield 127 and the upper layer core 132 are apart from each other at a predetermined gap g.

In other words, in the combined magnetic head 100, the second magnetic shield 127 not only magnetically shields an upper layer of a magnetoresistive effect device 126, but also functions as the magnetic core of the inductive magnetic head. The magnetic core of the inductive magnetic head is composed of the second magnetic shield 127 and the upper layer core 132. The gap g will be a magnetic gap for recording in the inductive magnetic head.

On the second magnetic shield 127, the thin film coil 133 buried into the insulation layer 123 is formed. The thin film coil 133 is formed to wind the magnetic core including the second magnetic shield 127 and the upper layer core 132. Although not shown, both ends of the thin film coil 133 are exposed externally. Terminals formed on the both ends of the thin film coil 133 will be external connection terminals of the inductive magnetic head. In other words, when the magnetic signal is recorded to the magnetic recording medium, recording current is supplied to the thin film coil 132 from the external connection terminals.

As described above, the laminated structure as the memory device according to the present technology can be applied as the playback head for the magnetic recording medium, i.e., the magnetosensitive device for detecting the magnetic signal from the magnetic recording medium.

According to the present technology, the memory device used in the memory apparatus is not limited to the illustrated configuration, i.e., the first ferromagnetic layer, the connecting layer and the second ferromagnetic layer are laminated in this order, one of the first ferromagnetic layer and the second first ferromagnetic layer is the in-face magnetization layer being predominant in the in-face magnetization, and the other is the perpendicular magnetization layer being predominant in the perpendicular magnetization.

As understood by the above description, in the memory device having such a configuration, depending on the setting of the connecting intensity between the first ferromagnetic layer and the second ferromagnetic layer via the connecting layer, the magnetization of the memory layer is directed to the perpendicular direction in the equilibrium state and the standby current flows, the magnetization direction of the memory layer is inclined from the perpendicular direction. The memory device used in the memory apparatus according to the present technology is not limited thereto as long as the memory device has the following configuration. In other words, the memory device has a layer structure at least including a memory layer where a direction of magnetization is changed corresponding to information, a magnetic fixed layer where the direction of the magnetization is fixed, and an intermediate layer made of a non-magnetic body disposed between the memory layer and the magnetic fixed layer; current being capable of flowing in a lamination direction of the layer structure, the magnetization of the memory layer directs to a perpendicular direction in an equilibrium state, and the direction of the magnetization of the memory layer is changed from the perpendicular direction to the inclined direction by flowing standby current.

The present technology may have the following configurations.

(1) A memory apparatus, including:
a memory device having:
a layer structure at least including a memory layer where a direction of magnetization is changed corresponding to information, a magnetic fixed layer where the direction of the magnetization is fixed, and an intermediate layer made of a non-magnetic body disposed between the memory layer and the magnetic fixed layer; current being capable of flowing in a lamination direction of the layer structure;
a wiring for supplying the memory device with current flowing to the lamination direction; and
a memory control unit for storing information by flowing standby current at a predetermined level to the memory device via the wiring to incline the magnetization direction of the memory layer from the direction perpendicular to a film surface and flowing recording current that is higher than the standby current via the wiring to change the magnetization direction of the memory layer.

(2) The memory apparatus according to (1) above, in which
a plurality of the memory devices are arranged, and the memory control unit controls a current supply to the memory device via the wiring such that a period for flowing the recording current to the memory device to be recorded and a period for flowing the standby current to the memory device to be recorded are overlapped.

(3) The memory apparatus according to (1) or (2) above, in which
the memory device has a cap layer, and
in the memory layer,
the first ferromagnetic layer, the connecting layer and the second ferromagnetic layer are laminated in this order,
the first ferromagnetic layer is magnetically connected to the second ferromagnetic layer via the connecting layer,
the first ferromagnetic layer is in contact with the intermediate layer,
the second ferromagnetic layer is in contact with the cap layer,
one of the first ferromagnetic layer and the second first ferromagnetic layer is the in-face magnetization layer being predominant in the in-face magnetization, and
the other is the perpendicular magnetization layer being predominant in the perpendicular magnetization.

(4) The memory apparatus according to (3) above, in which
in the memory layer, a connecting intensity between the first ferromagnetic layer and the second ferromagnetic layer via the connection layer is set such that both magnetizations of the first ferromagnetic layer and the second ferromagnetic layer direct to the perpendicular direction in an equilibrium state where no current in the lamination direction flows to the memory device.

(5) The memory apparatus according to (4) above, in which
the first ferromagnetic layer is the in-face magnetization layer, and the second ferromagnetic layer is the perpendicular magnetization layer.

(6) The memory apparatus according to (5) above, in which
while the standby current flows, an angle between the magnetization of the first ferromagnetic layer and the direction perpendicular to the film surface is greater than an angle between the magnetization of the second ferromagnetic layer and the direction perpendicular to the film surface.

(7) The memory apparatus according to (4) above, in which
the first ferromagnetic layer is the perpendicular magnetization layer, and the second ferromagnetic layer is the in-face magnetization layer.

(8) The memory apparatus according to (7) above, in which
while the standby current flows, an angle between the magnetization of the first ferromagnetic layer and the direction perpendicular to the film surface is smaller than an angle between the magnetization of the second ferromagnetic layer and the direction perpendicular to the film surface.

(9) The memory apparatus according to any one of (1) to (8) above, in which
the intermediate layer is a tunnel insulation layer.

(10) The memory apparatus according to any one of (3) to (9) above, in which
the cap layer includes an oxide layer.

(11) The memory apparatus according to any one of (3) to (10) above, in which
the first ferromagnetic layer and the second ferromagnetic layer includes Co—Fe—B layers.

It should be understood that various changes and modification to the presently preferred embodiments described herein will be apparent to those skilled n the art. Such changes and modification can be made without departing from the spirit and scope of the present subject matter and without diminishing its intended advantages. It is therefore intended that such changes and modifications can be covered by the appended claims.

DESCRIPTION OF SYMBOLS 1 gate electrode
2 device separation layer
3, 20 memory device
4 contact layer
6 bit line
7 source region
8 drain region
9 wiring
10 semiconductor substrate
11 underlayer
12 magnetization fixed layer
13 intermediate layer
14 memory layer
14$i$, 14$p$ ferromagnetic layer
14$c$ connection layer
15 cap layer (perpendicular magnetic anisotropy layer)

The invention claimed is:

1. A memory apparatus, comprising:
a memory device having:
a layer structure at least including a memory layer where a direction of magnetization is changed corresponding to information, a magnetic fixed layer where the direction of the magnetization is fixed, and an intermediate layer made of a non-magnetic body disposed between the memory layer and the magnetic fixed layer;
a current being capable of flowing in a lamination direction of the layer structure;
a wiring for supplying the memory device with the current flowing to the lamination direction; and
a memory control unit for controlling a current supply to the memory device via the wiring such at a period for flowing a recording current to the memory device to be recorded and a period for flowing a standby current to the memory device to be recorded are overlapped.

2. The memory apparatus according to claim 1, wherein a plurality of the memory devices are arranged, and the memory control unit stores information by flowing the standby current at a predetermined level to the memory device via the wiring to incline the magnetization direction of the memory layer from the direction perpendicular to a film surface and flowing the recording current that is higher than the standby current via the wiring to change the magnetization direction of the memory layer.

3. The memory apparatus according to claim 1, wherein the memory device has a cap layer, and
in the memory layer,
a first ferromagnetic layer, a connecting layer and a second ferromagnetic layer are laminated in this order,
the first ferromagnetic layer is magnetically connected to the second ferromagnetic layer via the connecting layer,
the first ferromagnetic layer is in contact with an intermediate layer,
the second ferromagnetic layer is in contact with the cap layer,
one of the first ferromagnetic layer and the second first ferromagnetic layer is an in-face magnetization layer being predominant in the in-face magnetization, and
the other is a perpendicular magnetization layer being predominant in the perpendicular magnetization.

4. The memory apparatus according to claim 3, wherein in the memory layer, a connecting intensity between the first ferromagnetic layer and the second ferromagnetic layer via the connection layer is set such that both magnetizations of the first ferromagnetic layer and the second ferromagnetic layer direct to the perpendicular direction in an equilibrium state where no current in the lamination direction flows to the memory device.

5. The memory apparatus according to claim 4, wherein the first ferromagnetic layer is the in-face magnetization layer, and the second ferromagnetic layer is the perpendicular magnetization layer.

6. The memory apparatus according to claim 5, wherein while the standby current flows, an angle between the magnetization of the first ferromagnetic layer and the direction perpendicular to the film surface is greater than an angle between the magnetization of the second ferromagnetic layer and the direction perpendicular to the film surface.

7. The memory apparatus according to claim 4, wherein the first ferromagnetic layer is the perpendicular magnetization layer, and the second ferromagnetic layer is the in-face magnetization layer.

8. The memory apparatus according to claim 7, wherein while the standby current flows, an angle between the magnetization of the first ferromagnetic layer and the direction perpendicular to the film surface is smaller than an angle between the magnetization of the second ferromagnetic layer and the direction perpendicular to the film surface.

9. The memory apparatus according to claim 1, wherein an intermediate layer includes a tunnel insulation layer.

10. The memory apparatus according to claim 3, wherein the cap layer includes an oxide layer.

11. The memory apparatus according to claim 3, wherein the first ferromagnetic layer and the second ferromagnetic layer includes Co-Fe-B layers.

12. A memory device, comprising:
a layer structure at least including a memory layer where a direction of magnetization is changed corresponding to information, a magnetic fixed layer where the direction of the magnetization is fixed, an intermediate layer made of a non-magnetic body disposed between the memory layer and the magnetic fixed layer, and a cap layer; a current being capable of flowing in a lamination direction of the layer structure;
in the memory layer,
a first ferromagnetic layer, a connecting layer and a second ferromagnetic layer are laminated in this order,
the first ferromagnetic layer is magnetically connected to the second ferromagnetic layer via the connecting layer,
the first ferromagnetic layer is in contact with an intermediate layer, the second ferromagnetic layer is in contact with the cap layer,
one of the first ferromagnetic layer and the second first ferromagnetic layer is an in-face magnetization layer being predominant in the in-face magnetization, and the other is a perpendicular magnetization layer being predominant in the perpendicular magnetization, and
a connecting intensity between the first ferromagnetic layer and the second ferromagnetic layer via the connection layer is set such that both magnetizations of the first ferromagnetic layer and the second ferromagnetic layer direct to the perpendicular direction in an equilibrium state where no current in the lamination direction flows to the memory device, and the magnetization direction of the memory layer is inclined from the perpendicular direction in a standby state,
a wiring for supplying the memory device with the current flowing to the lamination direction, and
a memory control unit for controlling a current supply to the memory device via the wiring such at a period for flowing a recording current to the memory device to be recorded and a period for flowing a standby current to the memory device to be recorded are overlapped.

13. The memory device according to claim 12, wherein the memory control unit stores information by flowing the standby current at a predetermined level to the memory device via the wiring to incline the magnetization direction of the memory layer from the direction perpendicular to a film surface and flowing the recording current that is higher than the standby current via the wiring to change the magnetization direction of the memory layer.

14. The memory device according to claim 12, wherein the first ferromagnetic layer is the in-face magnetization layer, and the second ferromagnetic layer is the perpendicular magnetization layer.

15. The memory device according to claim 12, wherein while the standby current flows, an angle between the magnetization of the first ferromagnetic layer and the direction perpendicular to the film surface is greater than an angle between the magnetization of the second ferromagnetic layer and the direction perpendicular to the film surface.

16. The memory device according to claim 12, wherein the first ferromagnetic layer is the perpendicular magnetization layer, and the second ferromagnetic layer is the in-face magnetization layer.

17. The memory device according to claim 12, wherein while the standby current flows, an angle between the magnetization of the first ferromagnetic layer and the direction perpendicular to the film surface is smaller than an angle between the magnetization of the second ferromagnetic layer and the direction perpendicular to the film surface.

18. The memory device according to claim 12, wherein the intermediate layer includes a tunnel insulation layer.

19. The memory device according to claim 12, wherein the cap layer includes an oxide layer.

20. The memory device according to claim 12, wherein the first ferromagnetic layer and the second ferromagnetic layer includes Co-Fe-B layers.

* * * * *